United States Patent [19]

Takase et al.

[11] Patent Number: 5,698,872
[45] Date of Patent: Dec. 16, 1997

[54] SEMICONDUCTOR MEMORY WHEREIN METALLIC INTERCONNECTION LAYER IS APPLIED WITH THE SAME POTENTIAL AS WORD LINE AND IS CONNECTED TO WORD LINE IN REGIONS OTHER THAN MEMORY CELLS

[75] Inventors: Shinsuke Takase, Yokohama; Hisashi Hashimoto, Yokosuka; Yutaka Tanaka, Yokohama, all of Japan

[73] Assignee: Kabushiki Kaisha Toshiba, Kawasaki, Japan

[21] Appl. No.: 476,905

[22] Filed: Jun. 7, 1995

Related U.S. Application Data

[63] Continuation of Ser. No. 283,196, Aug. 4, 1994, abandoned, which is a continuation of Ser. No. 946,784, Sep. 18, 1992, abandoned, which is a continuation of Ser. No. 580,568, Sep. 11, 1990, abandoned.

[30] Foreign Application Priority Data

Sep. 13, 1989 [JP] Japan ................... 1-237507

[51] Int. Cl.⁶ .................. H01L 27/040; H01L 27/020
[52] U.S. Cl. .................. 257/206; 257/207; 257/315; 257/903
[58] Field of Search ................... 257/206, 207, 257/920, 315, 316, 903, 904

[56] References Cited

U.S. PATENT DOCUMENTS

| | | | |
|---|---|---|---|
| 4,679,171 | 7/1987 | Logwood et al. | 357/23.9 |
| 4,707,718 | 11/1987 | Sakai et al. | 257/927 |
| 4,744,056 | 5/1988 | Yu et al. | 257/904 |
| 4,809,046 | 2/1989 | Aoyama et al. | 257/927 |
| 5,005,068 | 4/1991 | Ikeda et al. | 257/904 |

FOREIGN PATENT DOCUMENTS

| | | |
|---|---|---|
| 58-54654 | 3/1983 | Japan . |
| 59-4159 | 1/1984 | Japan . |

OTHER PUBLICATIONS

Japanese Patent Abstract, vol. 10, No. 205, Jul. 17, 1986, abstracting JP61-046059, published Mar. 6, 1986.
Japanese Patent Abstract, vol. 11, No. 119, Apr. 14, 1987, abstracting JP61-267347, published Nov. 26, 1986.
Japanese Patent Abstract, vol. 11, No. 382, Dec. 12, 1987, abstracting JP62-145862, published Jun. 29, 1987.
Japanese Patent Abstract, vol. 13, No. 396, Sep. 4, 1989, abstracting JP1-140741, published Jun. 1, 1989.

*Primary Examiner*—Donald Monin
*Attorney, Agent, or Firm*—Finnegan, Henderson, Farabow, Garrett & Dunner, L.L.P.

[57] ABSTRACT

Memory cells, which serve as basic cells, are arranged in a matrix pattern. The memory cells are each provided with a word line which is integral with the gate electrode of a switch element and which is formed of polysilicon. A metallic interconnection layer is arranged above the word line and is applied with substantially the same potential as the word line. The metallic interconnection layer and the word line are connected together via through-holes. The through-holes are formed in through-hole cells, which also serve as basic cells. The through-hole cells and the memory cells are arranged such that the number of rows of the former and the number of rows of the latter are in the ratio of one to at least two.

9 Claims, 7 Drawing Sheets

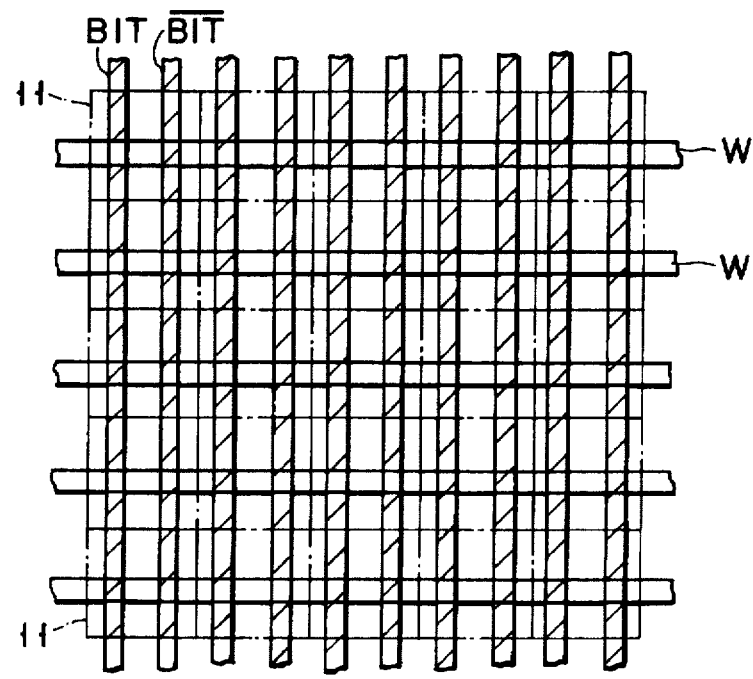
F I G. 3
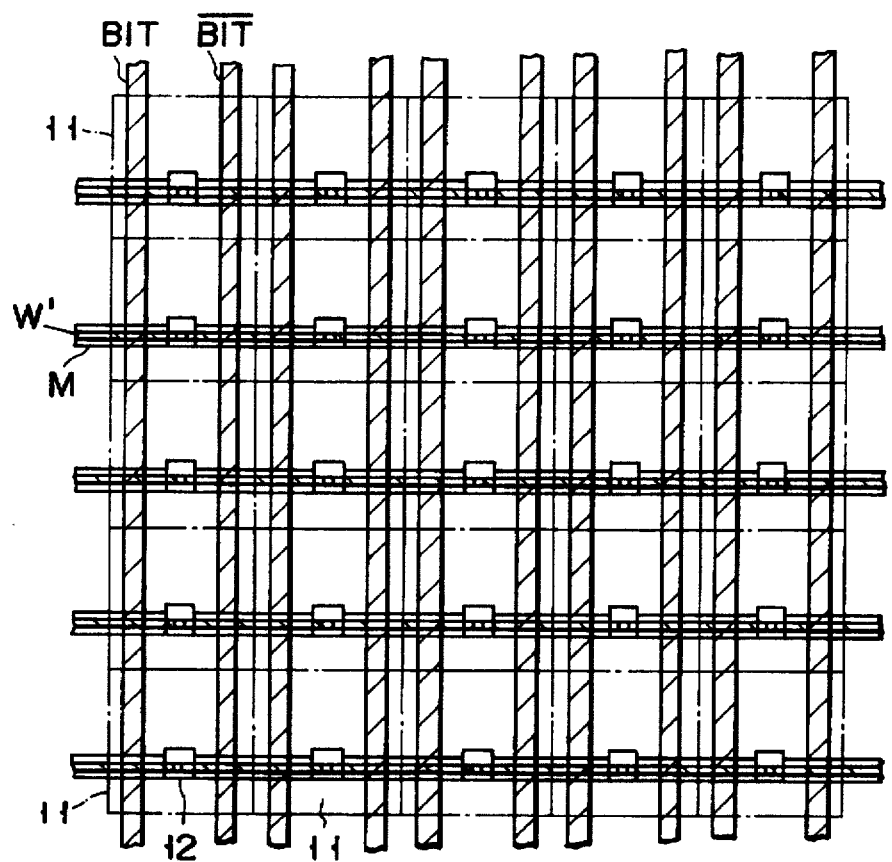
F I G. 5

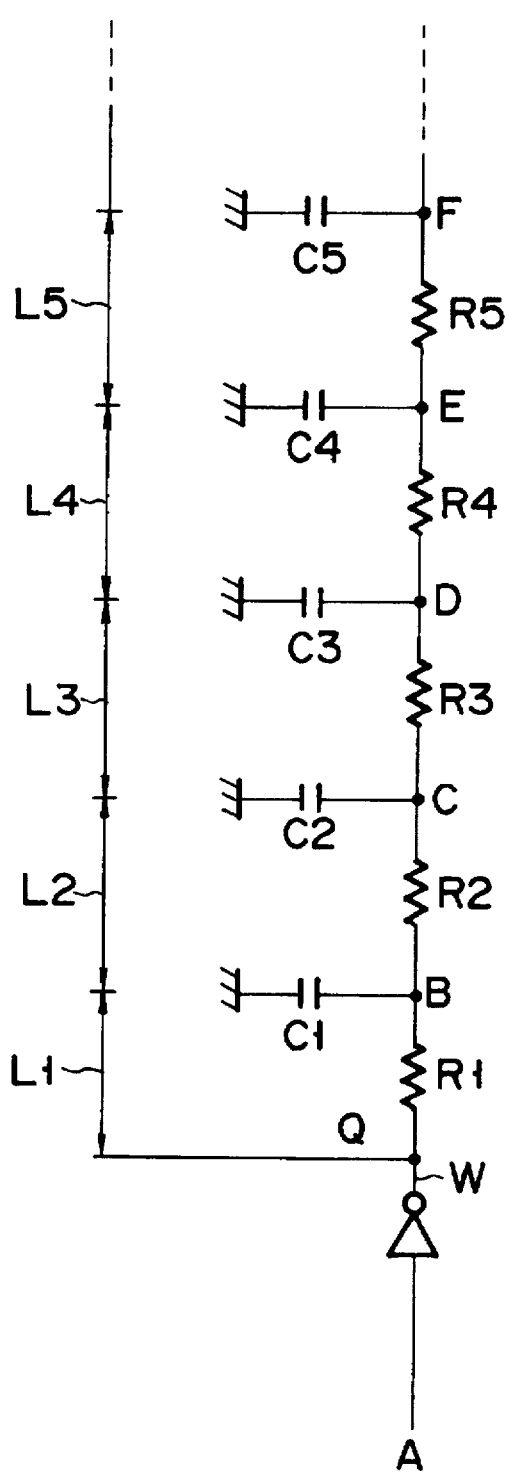
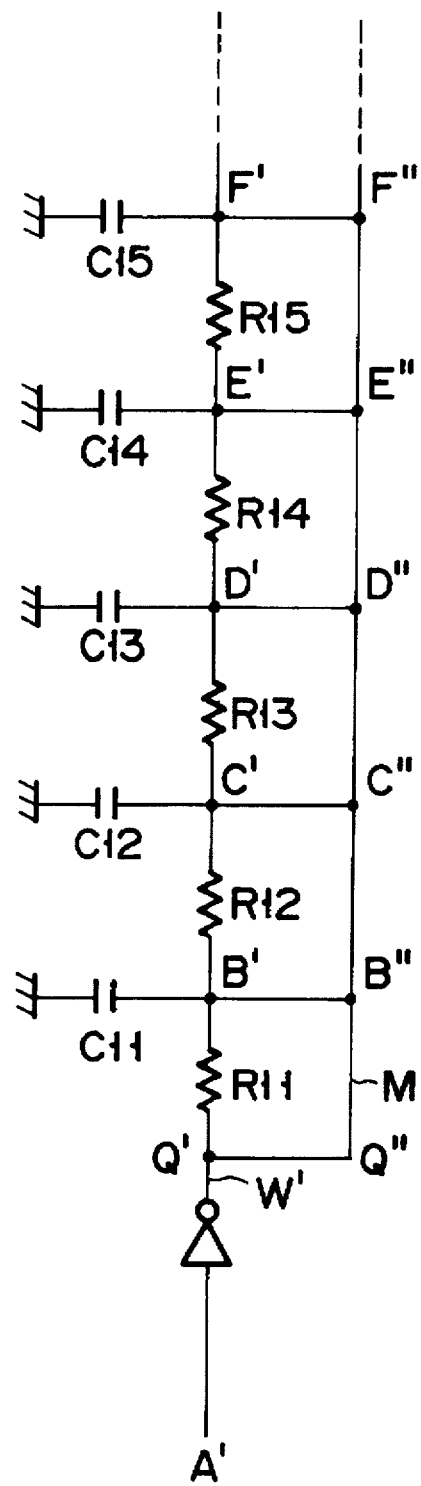
F I G. 4        F I G. 6

SEMICONDUCTOR MEMORY WHEREIN METALLIC INTERCONNECTION LAYER IS APPLIED WITH THE SAME POTENTIAL AS WORD LINE AND IS CONNECTED TO WORD LINE IN REGIONS OTHER THAN MEMORY CELLS

This application is a continuation of application Ser. No. 08/283,196, filed Aug. 4, 1994, now abandoned, which is a continuation of application Ser. No. 07/946,784, filed Sep. 18, 1992, now abandoned, which is a continuation of application Ser. No. 07/580,568, filed Sep. 11, 1990, now abandoned.

BACKGROUND OF THE INVENTION

1. Field of the Invention

The present invention relates to an improved semiconductor memory which employs a multi-level interconnection structure.

2. Description of the Related Art

In the field of application specific integrated circuits (ASICs), a variable bit type memory wherein the bit length is variable is well known. To obtain this type of memory by use of a standard cell arrangement, memory cells (i.e., basic cells) are arranged on a semi-conductor substrate in a matrix pattern. Each of the memory cells is made up of: a storage portion for storing information; and a switch element which is operated by means of a word line used for the selection of the memory cell. The switch element is inserted between the storage portion and a bit line used for transmitting the information from the memory cell. In order to minimize the area of the memory cell, the word line is made of the same material as that of the gate electrode of the switch element. For example, the word line is made of polysilicon. On the other hand, the bit line is made by a first-level metallic interconnection layer which is formed of aluminum, for example.

FIG. 1 shows a circuit diagram of a static memory employing six transistors, and FIG. 2 is a plan view showing the horizontal pattern of that static memory. In FIGS. 1 and 2, reference numeral 1 denotes an information storage portion of a flip-flop type, reference 2 denotes a switch element; reference symbols W1 to wn denote word lines; and B1 and $\overline{B1}$ (likewise, B2 and $\overline{B2}$; B3 and $\overline{B3}$; etc.) denote a pair of bit lines.

In general, two types of arrangements can be selectively employed for the memory mentioned above.

FIG. 3 is a plan view showing the pattern of the first type of arrangement, and FIG. 4 is an equivalent circuit diagram corresponding to the first type of arrangement shown in FIG. 3.

Referring to FIG. 3, memory cells 11 are arranged in a matrix pattern. A pair of bit lines BIT and $\overline{BIT}$ used for the memory cells 11 arranged in one column are constituted by first-level metallic interconnection layers formed of aluminum. A word line W is integrally formed with the gate electrodes of the switch elements (not shown) of the memory cells 11 arranged in one row. The material of the gate electrodes (namely, the material of the word line W) is polysilicon, for example. In FIG. 4, R1–R5 denote resistance components of the word line W, and C1–C5 denote capacitance components, such as a gate capacitance and a floating capacitance.

In the case where the word line W is formed only of the same material as that of the gate electrodes, the times required for the potential of the word lines W to rise and fall, respectively, are delayed due to the resistance components R1–R5 and the capacitance components C1–C5. This delay is lengthened in proportion to the length of the word line W. Therefore, if the memory has a large memory capacity, the delay is long, thus adversely affecting the performance of the memory. For example, in the circuit shown in FIG. 4, different loads are applied to points B, C, D, etc. which are located away from point Q by the distances L1, (L1+L2), (L1+L2+L3), etc., respectively. Therefore, the voltage applied to point Q is transmitted to points B, C, D, etc. after being delayed by the intervals respectively determined by the time constants of the resistor and capacitor components. In the arrangement, therefore, the time required for accessing the memory is lengthened in accordance with the length of the word line W.

FIGS. 5 and 6 show the second type of arrangement which can be employed for the memory mentioned above and which is free from the problem entailed in the first type of arrangement. Specifically, FIG. 5 is a plan view showing the pattern of the second type of arrangement, and FIG. 6 is an equivalent circuit diagram corresponding to the second type of arrangement shown in FIG. 5.

Referring to FIG. 5, memory cells 11 are arranged in a matrix pattern. A pair of bit lines BIT and $\overline{BIT}$ used for the memory cells 11 arranged in one column are respectively constituted by first-level metallic interconnection layers, which are formed of e.g. aluminum. A word line W' is integrally formed with the gate electrodes of the switch elements (not shown) of the memory cells 11 arranged in one row. The material of the gate electrodes (namely, the material of the word line W') is polysilicon, for example. A second-level metallic interconnection layer M, which is formed of e.g. aluminum, is located above the word line W'. The second-level metallic interconnection layer M and the word line W' are connected to each other via through-holes 12. In FIG. 6, R11–R15 denote resistance components of the word line W', and C11–C15 denote capacitance components, such as a gate capacitance and a floating capacitance. Reference symbols Q', B', C', etc., and Q", B", C", etc. indicate contact portions between the word line W' and the second-level metallic interconnection layer M.

In the second type of arrangement, the second-level metallic interconnection layer M is located above the word line W', and is connected to the word line W' by way of through-holes 12. With this structure, the word line potential is not delayed, as it is in the first type of arrangement. However, the second type of arrangement is faced with another problem. Since the second-level metallic interconnection layer M and the word line W' are connected together via the through-holes 12, contact portions are provided on the respective memory cells 11. As a result, the area of the entire memory is inevitably large, as may be understood from the comparison between FIGS. 3 and 5.

SUMMARY OF THE INVENTION

Accordingly, an object of the present invention is to provide a semiconductor memory in which the delay time of the interconnection layers is short, and which has a pattern that does not occupy a wide installation area.

This object is achieved by a semiconductor memory wherein memory cells serving as basic cells are arranged in a matrix pattern and which comprises:
- a word line being integral with gate electrodes of switch elements which constitute part of the memory cells;
- a metallic interconnection layer arranged along the word line and applied with substantially the same potential as the word line; and through-holes located in regions other than the memory cells and used for connecting the metallic interconnection layer and the word line together, the through-holes being smaller in number than the memory cells.

In the present invention, the word line, which is integral with the gate electrodes of switch elements constituting part of memory cells, is connected to the metallic interconnection layer by use of through-holes, and the number of the through-holes is smaller than that of the memory cells. With this structure, the area of the entire memory can be reduced, and the delay time of the metallic interconnection layer can be as short as possible.

In addition, since the through-holes are located in regions other than the memory cells, the area of each memory cell can be reduced.

Moreover, the intervals at which the through-holes are arranged can be determined on the basis of the access time the user wants. If the access time the user wants is comparatively long, the through-holes can be arranged at long intervals. In this case, the memory does not operate at a high speed but has a small area. Conversely, if the access time the user wants is comparatively short, the through-holes are arranged at short intervals. In this case, the memory may have a large area but operates at a high speed.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view of the pattern of the first type of arrangement which constitutes the memory shown in FIGS. 1 and 2;

FIG. 4 shows an equivalent circuit diagram corresponding to the first type of arrangement shown in FIG. 3;

FIG. 5 is a plan view of the pattern of the second type of arrangement which constitutes the memory shown in FIGS. 1 and 2;

FIG. 6 shows an equivalent circuit diagram corresponding to the second type of arrangement shown in FIG. 5;

DETAILED DESCRIPTION OF THE PREFERRED EMBODIMENTS

Embodiments of the present invention will now be described, with reference to the accompanying drawings.

Figure 7:
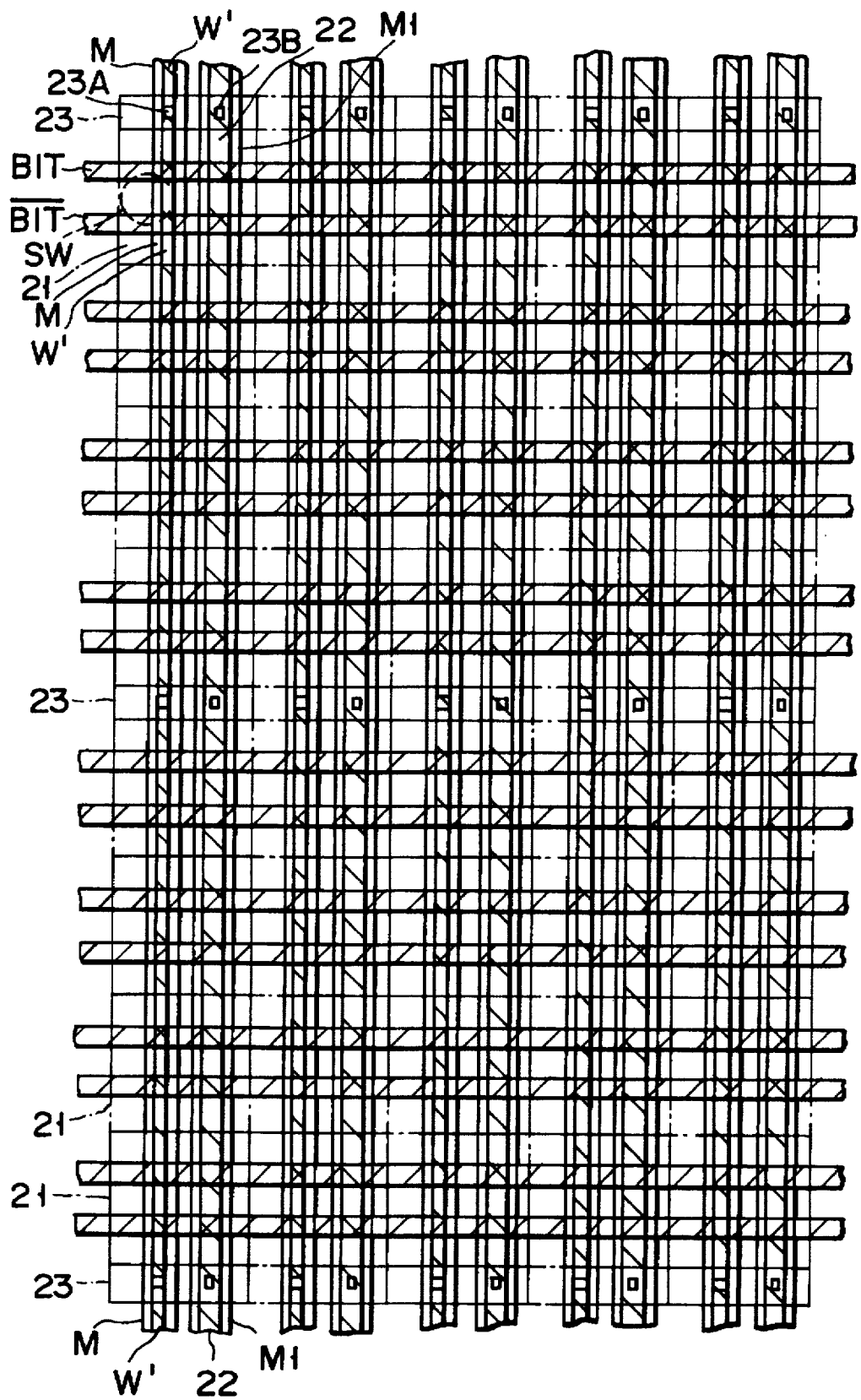
FIG. 7 is a plan view of the pattern of the first embodiment of the present invention.

FIG. 7 shows the first embodiment of the present invention. The basic cells of this embodiment include not only memory cells but also through-hole cells. Each of the through-hole cells has a through-hole which is used for connection between interconnection layers. The through-hole cells and the memory cells are arranged such that the number of rows of the former and the number of rows of the latter are in the ratio of one to at least two.

Figure 1:
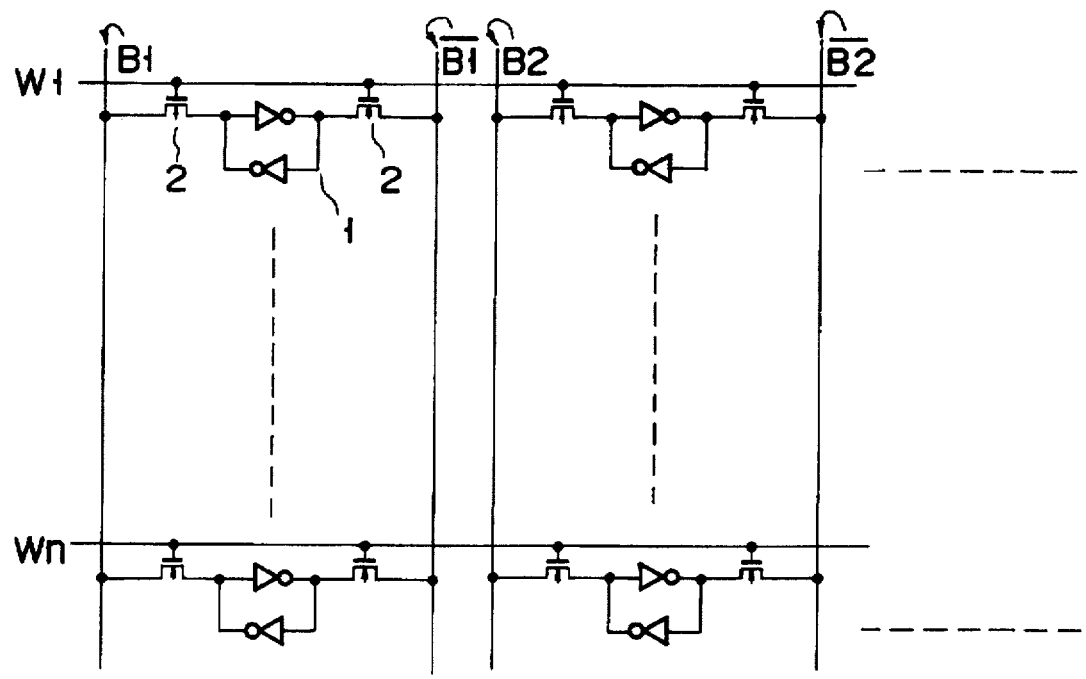
FIG. 1 is a circuit diagram showing a static memory.
Figure 2:
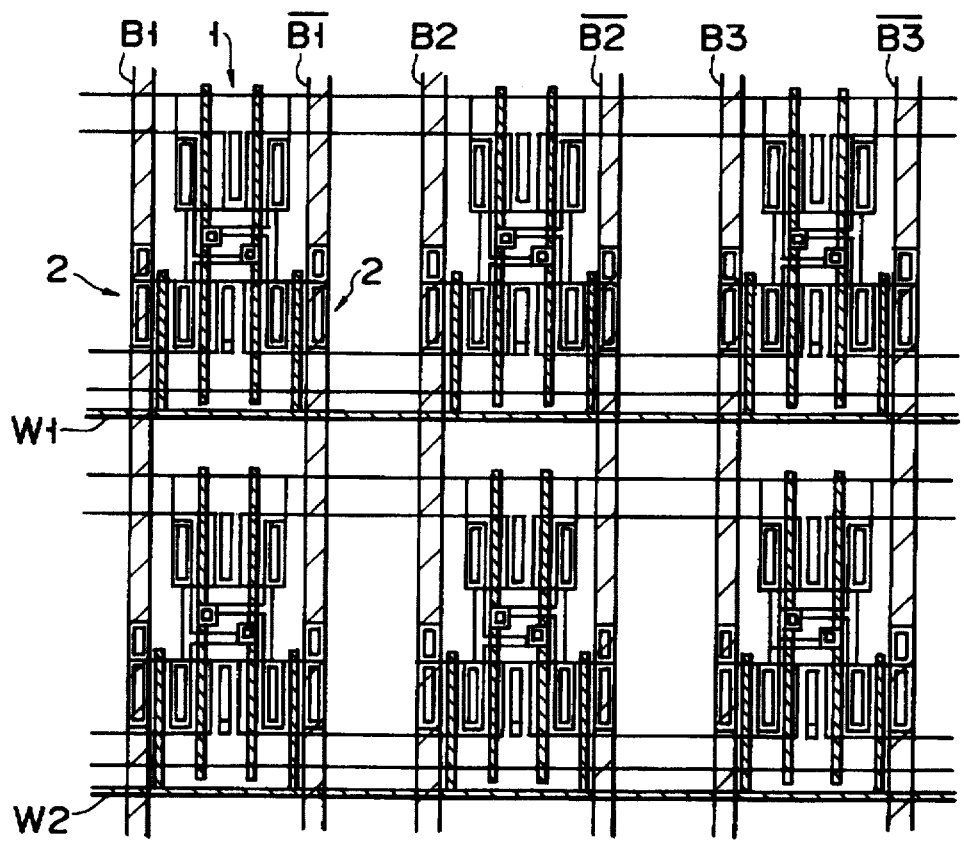
FIG. 2 is a plan view of the pattern of the static memory shown in FIG. 1.

Reference numeral 21 in FIG. 7 denotes memory cells each of which serves as a basic cell. The memory cells 21 are static RAMs which are similar to those shown in FIG. 2, and are arranged on a substrate (not shown) in a matrix pattern. A pair of bit lines BIT and $\overline{\text{BIT}}$ used for the memory cells 21 arranged in one row are respectively constituted by a first-level metallic interconnection layers which are formed of aluminum, for example. Word lines W' are formed in such a manner as to be integral with the gate electrodes of the switch elements of the memory cell 21 arranged in one column. The material of the gate electrodes of the switch elements is polysilicon, for example. In FIG. 7, reference symbol SW indicates an area in which the switch element is to be formed. A second-level metallic interconnection layer M, which is formed of e.g. aluminum, is provided above each word line W'. The memory cells 21 are provided with a power supply line 22 which is made by a diffusion layer. A second-level metallic interconnection layer M1 is provided above each power supply lines 22.

Through-hole cells 23, each serving as a basic cell, are provided with word lines W' which are similar to those provided for the memory cells 21. The second-level metallic interconnection layer M mentioned above is located above each word line W', and is connected to the word line W' via through-holes 23A. Like the memory cells 21, the through-hole cells 23 are provided with a power supply line 22 which is made by a diffusion layer. The second-level metallic interconnection layer M1 mentioned above is located above each power supply line 22. The power supply lines 22 and the second-level metallic interconnection layer M1 are connected together via through-holes 23B. The through-hole cells 23 and the memory cells 21 are arranged such that the number of rows of the former and the number of rows of the latter are in the ratio of one to at least two. Since the through-hole cells 23 can be arranged in accordance with the arrangement of the memory cells 21, the second-level metallic the second-level metallic interconnection layers M1 are connected together. It should be noted that the second-level metallic interconnection layers M and the word lines W' are connected together via the through-holes 23A of the through-hole cells, and that the second-level metallic interconnection layers M1 and the power supply lines 22 are connected together via the through-holes 23B of the through-hole cells 23.

In the embodiment mentioned above, a through-hole is not formed in each memory cell but in each through-hole cell 23. With this structure, each memory cell is allowed to have a small area. In addition, since the number of rows of the through-hole cells 23 and the number of rows of the memory cells 11 are in the ratio of one to at least two, the area of the entire memory can be small.

Further, the word lines W' and the second-level interconnection layer M are connected together via the through-holes 23A. With this structure, the potential variation of the word lines is prevented from being delayed.

Still further, the power supply lines 22 and the second-level metallic interconnection layer M1 are connected together via the through-holes 23B. With this structure, the power source voltage is prevented from decreasing, and simultaneously, the noise in the power supply can be suppressed, thus ensuring a stable operation.

The intervals at which the through-hole cells 23 are arranged can be determined on the basis of the access time the user wants. If the access time the user wants is comparatively long, the through-hole cells 23 are arranged at long intervals. In this case, the memory does not operate at a high speed but has a small area. Conversely, if a short access time is required, the through-hole cells 23 are arranged at short intervals. In this case, the memory may have a large area but operates at a high speed.

Figure 8:
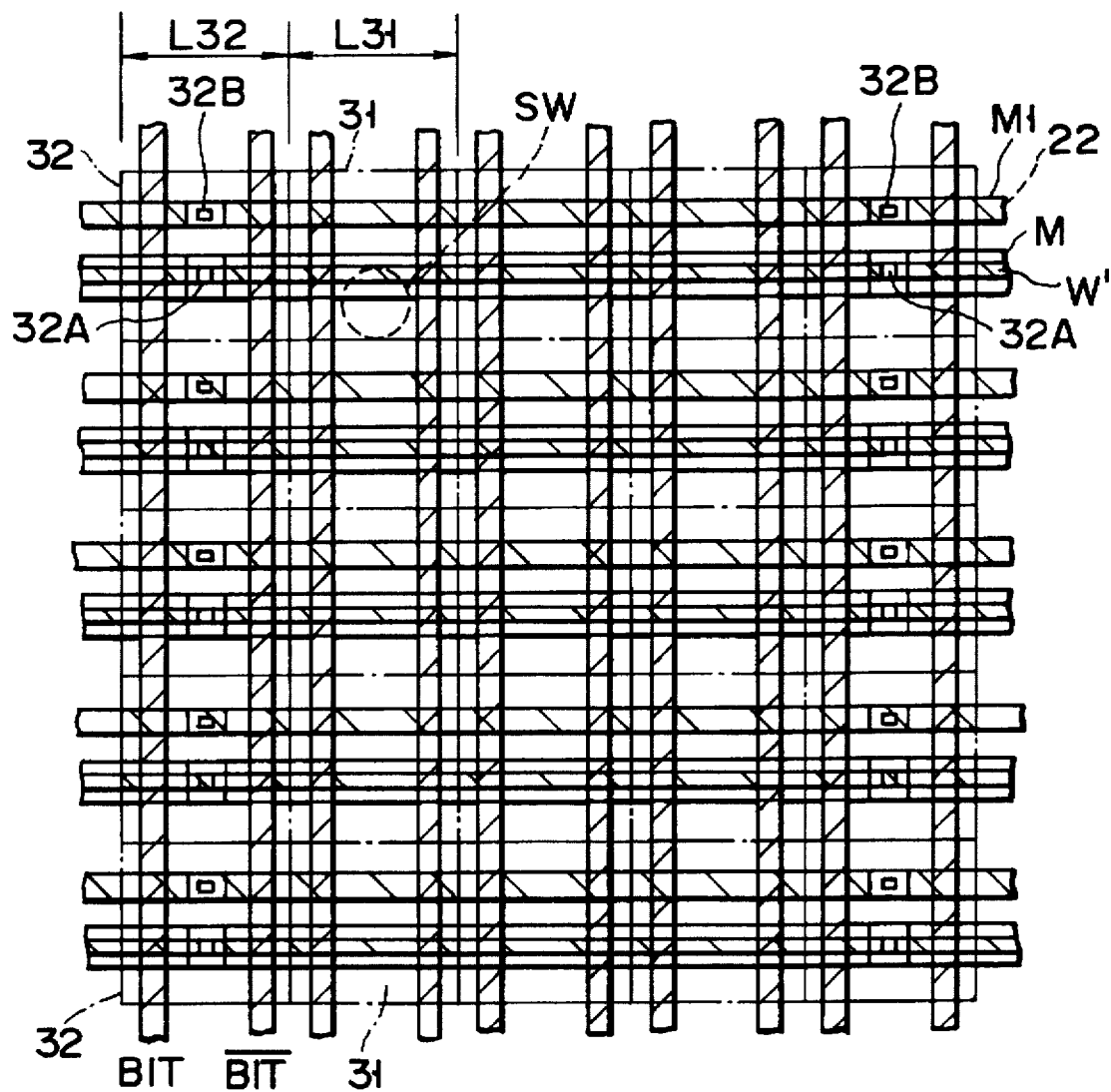
FIG. 8 is a plan view of the pattern of the second embodiment of the present invention.

FIG. 8 shows the second embodiment of the present invention. The memory of this embodiment is comprised of first memory cells 31 each of which has no through-hole, and second memory cells 32 each of which has a through-hole used for interconnection. The second memory cells 32 and the first memory cells 31 are arranged such that the number of rows of the former and the number of rows of the latter are in the ratio of one to at least two.

In the second embodiment shown in FIG. 8, the first memory cells 31 have a similar structure to that of the memory cells 11 shown in FIG. 7. The second memory cells 32 have a similar structure to that of the first memory cells 31, but differ from the first memory cells 31 in that each of them is provided with two through-holes 32A and 32B. The through-hole 32A is used for connecting the second-level metallic interconnection layer M and the word line W' together, while the through-hole 32B is used for connecting the power supply line 22 and the second-level metallic interconnection layer M1 together. As is shown in FIG. 8, the first memory cells 31 are arranged in a matrix pattern, and the second memory cells 32 are provided such that the number of rows of the second memory cells 32 and the number of rows of the first memory cells 31 are in the ratio of one to at least two. Due to this arrangement of the first and second memory cells 31 and 32, the second-level metallic interconnection layers M are connected together, and the word lines W' are connected together. In addition, the power supply lines 22 are connected together, and the second-level metallic interconnection layers M1 are also connected together. It should be also noted that second-level metallic interconnection layers M and the word lines W' are connected via the through-holes 32A of the second memory cells 32, and that the second-level metallic interconnection layer M1 and the power supply lines 22 are connected via the through-holes 32B of the second memory cells 32.

In the second embodiment mentioned above, the second memory cell 32 has through-holes 32A and 32B, but first memory cell 31 does not. It should be noted that the second memory cell 32 has a side longer than that of the first memory cell 31. That is, L31<L32 (L31: the length of one side of the first memory cell, L32: the length of one side of the second memory cell). Accordingly, the area of the first memory cell 31 is smaller than that of the second memory cell 32. It should be also noted that the number of rows of the second memory cells 32 and the number of rows of the first memory cells 31 are in the ratio of one to at least two. Since, therefore, the number of second memory cells 32 used is smaller than that of first memory cells 31, the area of the entire memory can be reduced, accordingly.

Moreover, the word lines W' and the second-level metallic interconnection layer M are connected together via the through-holes 32A, while the power supply lines 22 and the second-level metallic interconnection layer M1 are connected together via the through-holes 32B. With this structure, the potential variation of the word lines is prevented from being delayed, and the power supply voltage is prevented from decreasing.

Figure 9:
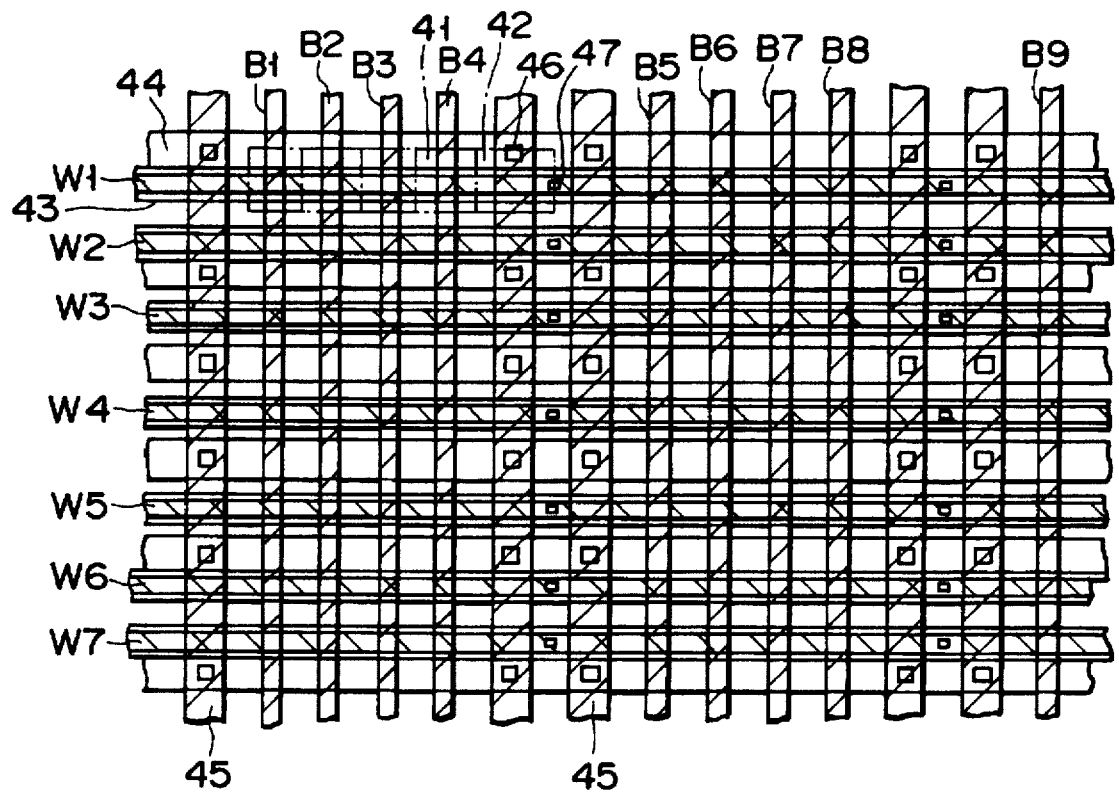
FIG. 9 is a plan view of the pattern of the third embodiment of the present invention.
Figure 10:
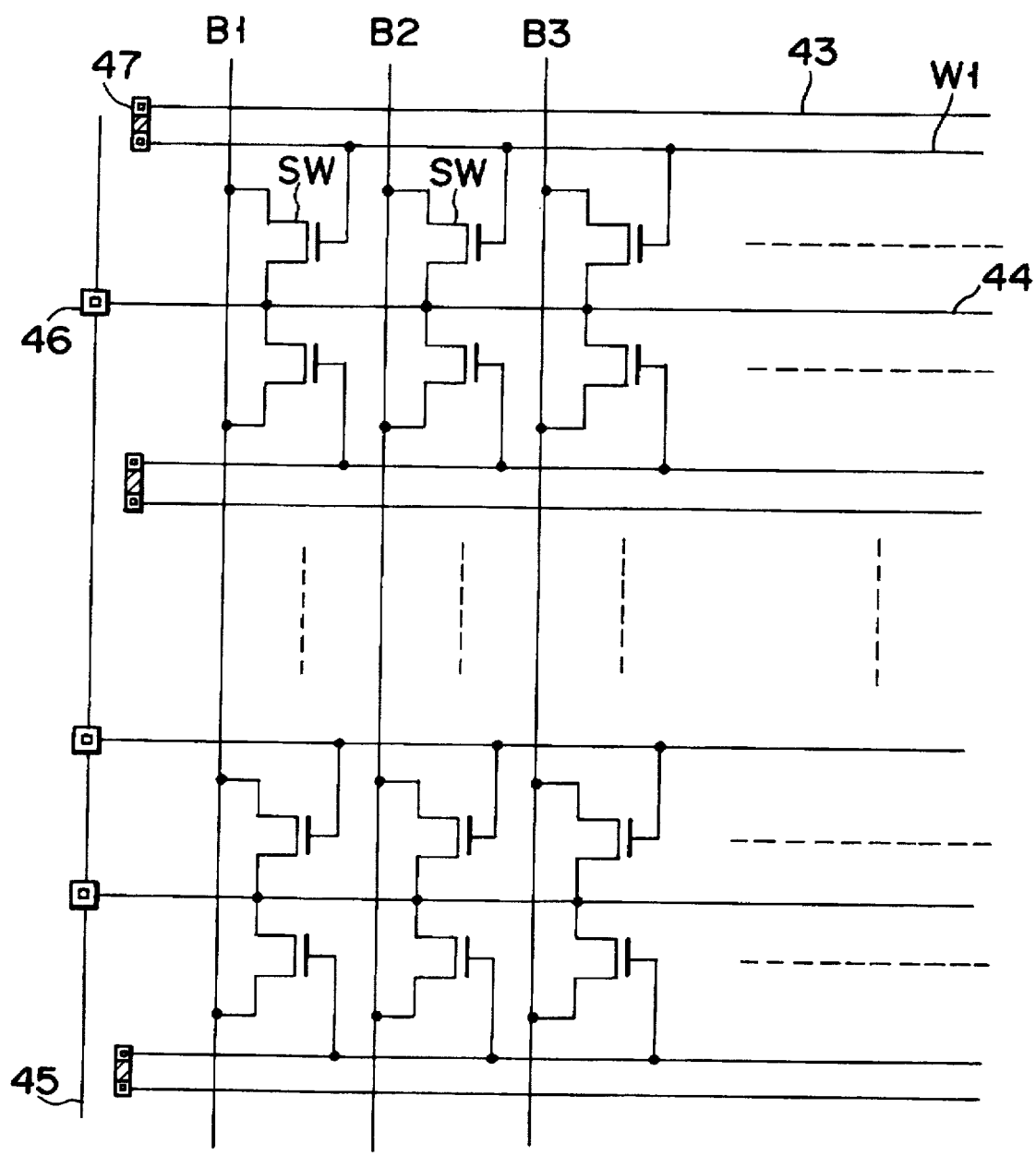
FIG. 10 shows an equivalent circuit diagram corresponding to the third embodiment shown in FIG. 9.

FIGS. 9 and 10 show the third embodiment of the present invention. FIG. 9 is a plan view of the pattern showing a mask ROM to which the present invention is applied, and FIG. 10 shows an equivalent circuit corresponding to the mask ROM shown in FIG. 9.

The mask ROM of the third embodiment is comprised of memory cells 41 each of which has no through-hole, and through-hole cells 42 each of which has a through-hole used for interconnection. The through-hole cells 42 are provided such that the number of rows of the through-hole cells 42 and the number of rows of the memory cells 41 are in the ratio of one to at least two.

Referring to FIGS. 9 and 10, the memory cells 41 are provided with bit lines B1-B9. These bit lines B1-B9 are constituted by first-level metallic interconnection layers which are formed of aluminum, for example. The memory cells 41 are also provided with word lines W1-W7. These word lines W1-W7 are formed of polysilicon, for example, and are integral with the gate electrodes of switch elements SW. A second-level metallic interconnection layer 43, which is formed of e.g. aluminum, is provided above each word lines W1-W7. The memory cells 41 are further provided with power supply lines 44 which are formed by diffusion layers. The through-hole cells 42 are provided with first-level power supply lines 45, which are formed of aluminum, for example. The above-mentioned word lines W1-W7 and the metallic interconnection layers 43 are located above the first-level power supply lines 45 together. Each of the through-hole cells 42 comprises two through-holes 46 and 47, the former through-hole 46 being used for connecting the power supply lines 44 and 45, and the latter through-hole 47 being used for connecting the word lines W1-W7 and the second-level metallic interconnection layer 43 together. The through-hole cells 42 are arranged such that the number of rows of the through-hole cells 42 and the number of rows of the memory cells 41 are in the ratio of one to at least two. With this structure, the third embodiment produces the substantially the same advantages as those of the first and second embodiments.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory by use of standard cell arrangement, comprising:

a substrate having an area extending in a first plane and a thickness extending substantially orthogonal to the first plane;

a matrix-of basic memory cells disposed on the substrate and spaced from each other in the first plane, each basic memory cell including a switching element having a diffusion layer parallel to the first plane and a gate electrode parallel to the first plane;

a plurality of conductive word lines, each integral with a plurality of the gate electrodes of the switching elements, for connection to a predetermined potential, whereby each of said plurality of conductive word lines is parallel to the first plane;

a plurality of power supply lines each integral with a plurality of the diffusion layers of the switching elements, whereby each of said plurality of power supply lines is parallel to said plurality of conductive word lines;

a plurality of first metallic interconnection layers, separated from the plurality of power supply lines by an isolation layer, said first metallic interconnection layers extending parallel to each of the plurality of power supply lines and parallel to the first plane;

a plurality of second metallic interconnection layers, each separated from a respective one of the plurality of conductive word lines by an isolation layer and each of said plurality of second metallic interconnection layers extending parallel to said respective conductive word line, for connection to said predetermined potential;

a plurality of first contact elements, each electrically connecting a respective one of said plurality of second metallic interconnection layers to the respective one of said plurality of conductive word lines for decreasing delay in variation of a potential along the respective one of said plurality of conductive word lines; and a plurality of second contact elements electrically connecting said plurality of power supply lines to said first metallic interconnection layers, wherein each of the plurality of first contact elements connecting one of the plurality of conductive word lines to a respective one of the plurality of second metallic interconnection layers and a corresponding nearby second contact element connecting one of the plurality of power supply lines to a respective one of the plurality of first metallic interconnection layers are arranged on one of a plurality of lines perpendicular to the plurality of word lines.

2. A semiconductor memory according to claim 1, wherein said gate electrodes are formed of polysilicon.

3. A semiconductor memory according to claim 1, wherein said first-level and second-level metallic interconnection layers are formed of aluminum.

4. A semiconductor according to claim 1, further comprising:

a plurality of cells located in regions between said memory cells in the first plane and fewer in number than the memory cells, each of said plurality of cells containing at least one of said plurality of first contact elements and containing no storage elements.

5. A semiconductor memory according to claim 4, wherein each of the plurality of second contact elements is formed in one of said plurality of cells.

6. A semiconductor memory comprising:

a plurality of basic memory cells, each of the basic memory cells including:

a first element forming region;

a switching element provided on the first element forming region and having a gate electrode;

a first conductive word line connected to the gate electrode, one and another ends of said first conductive word line being positioned on opposing sides of said first element forming region, respectively; and a first metallic interconnection layer insulated from the first conductive word line, the first metallic interconnection layer being provided in proximity to the first conductive word line and in parallel with the first conductive word line, one and another ends of the first metallic interconnection layer being positioned on the opposing sides of the first element forming region, respectively, and basic cells separate from the basic memory cells and fewer than the basic memory cells in number, the basic cells including:

a second element forming region;

a second conductive word line provided on the second element forming region to be on a same position as the first word line, one and another ends of said second conductive word line being positioned on opposing sides of said second element forming region, respectively;

a second metallic interconnection layer insulated from the second conductive word line and provided on a same position as the first metallic interconnection layer, the second metallic interconnection layer being provided in proximity to the second conductive word line and in parallel with the second conductive word line, one and another ends of the second metallic interconnection layer being positioned on the opposing sides of the second element forming region, respectively; and a first contact element for electrical connection between the second conductive word line and the second metallic interconnection layer, wherein the basic memory cells are arranged in rows and columns, the first conductive word line and the first metallic interconnection layer for each of the first basic memory cells are connected to each other, one row of the basic cells are arranged for a respective plurality of rows of the basic memory cells, the second conductive word lines of each column of the basic cells is connected to the first conductive word lines in the corresponding column of the basic memory cells, the second metallic interconnection layers for each column of the basic cells are connected to the first metallic interconnection layers in each corresponding column of the basic memory cells to thereby reduce delay of potential variations of the first and second conductive word lines, further comprising:

a first plurality of power supply lines, each extending along at least a respective one of the first and second conductive word lines, for providing power to said cells of the semiconductor memory;

a second plurality of mutually parallel metallic power supply lines in proximity to said first plurality of power supply lines; and a second contact element nearby each said first contact element for electrical connection between one of the plurality of first power supply lines and a respective one of said plurality of second power supply lines, wherein said first contact element and said nearby second contact element are arranged on one of a plurality of lines intersecting the plurality of word lines.

7. A semiconductor memory by use of standard cell arrangement comprising:

a plurality of basic cells serving as memory cells each including a switching element having a gate electrode;

a plurality of cells smaller in number than said plurality of basic cells, including no switching elements and interspersed in a matrix together with said plurality of basic cells;

a plurality of word lines extending to each of said plurality of basic cells and extending to each of said plurality of cells and connected to the gate electrodes of said plurality of basic cells;

a plurality of first metal wiring layers parallel to said plurality of word lines and each in proximity to a corresponding one of said plurality of word lines;

a plurality of power supply lines, extending to said basic cells and said plurality of cells parallel to said plurality of first metal wiring layers for supplying power to the switching elements of said basic cells;

a plurality of second metal wiring layers extending parallel to said plurality of power supply lines;

a plurality of first contact elements, each being provided in one of said plurality of cells for connecting one of said plurality of word lines and a corresponding one of said plurality of first metal wiring layers; and a plurality of second contact elements, each being provided in one of said plurality of cells for connecting one of said plurality of power supply lines and a corresponding one of said plurality of second metal wiring layers, wherein each of the plurality of first contact elements connecting one of the plurality of word lines to a corresponding one of the plurality of first metal wiring layers and a respective nearby second contact element connecting one of the plurality of power supply lines to a corresponding one of the plurality of second metal wiring layers are arranged on one of a plurality of lines perpendicular to the plurality of word lines.

8. A semiconductor memory by use of standard cell arrangement comprising:

a plurality of first basic cells serving as memory cells each including a switching element having a gate electrode, a plurality of second basic cells serving as memory cells each including a switching element having a gate electrode, said plurality of second basic cells being smaller in number than said plurality of first basic cells and interspersed in a matrix together with said plurality of first basic cells;

a plurality of word lines connected to the gate electrodes of said pluralities of first and second basic cells;

a plurality of first metal wiring layers extending parallel to said word lines;

a plurality of power supply lines, each extending to said plurality of first basic cells and to said plurality of second basic cells parallel to said first metal wiring layers, for supplying power to the switching elements of said pluralities of first and second basic cells;

a plurality of second metal wiring layers, each extending parallel to said plurality of power supply lines and in proximity to respective one of said power supply lines;

a plurality of first contact elements, each being provided in a respective one of said plurality of second basic cells for connecting one of said word lines and a corresponding one of said first metal wiring layers; and a plurality of second contact elements, each being provided in a respective one of said plurality of second basic cells for connecting a respective one of said plurality of power supply lines and a corresponding one of said plurality of second metal wiring layers.

9. A semiconductor memory comprising:

a plurality of basic memory cells, each of the basic memory cells including:

a first element forming region;

a switching element provided on the first element forming region and having a gate electrode;

a first conductive word line connected to the gate electrode, one and another ends of the first conductive word line being positioned on opposing sides of the first element forming region, respectively;

a first metallic interconnection layer insulated from the first conductive word line, the first metallic interconnection layer being provided in proximity to the first conductive word line and in parallel with the first conductive word line, one and another ends of the first metallic interconnection layer being positioned on the opposing sides of the first element forming region, respectively;

a first power supply line, connected to the switching element, for providing power supply to said switching element, the first power supply line being provided in parallel with the first conductive word line, one and another ends of the first power supply line being positioned on the opposing sides of the first element forming region, respectively; and a second metallic interconnection layer insulated from the first power supply line, the second metallic interconnection layer being positioned in proximity to the first power supply line and in parallel with the first power supply line, one and another ends of the second metallic interconnection layer being positioned on the opposing sides of the first element forming region, and basic cells separate from the basic memory cells and fewer than the basic memory cells in number, each of the basic cells including:

a second element forming region;

a second conductive word line provided on the second element forming region to be on a same position as the first conductive word line, one and another ends of the second conductive word line being positioned on the opposing sides of the second element forming region;

a third metallic interconnection layer insulated from the second conductive word line and provided on a same position as the first metallic interconnection layer, the third metallic interconnection layer being provided in proximity to the second conductive word line and in parallel with the second conductive word line, one and another ends of the third metallic interconnection layer being positioned on opposing sides of the second element forming region, respectively;

a first contact element for electrical connection between the second conductive word line and the third metallic interconnection layer;

a second power supply line provided on the second element forming region to be on a same position as the first power supply line, the second power supply line being provided in parallel with the second conductive word line, one and another ends of the second power supply line being positioned on opposing sides of the second element forming region;

a fourth metallic interconnection layer insulated from the second power supply line, the fourth metallic interconnection layer being provided in proximity to the second power supply line and in parallel with the second power supply line, one and another ends of the fourth metallic interconnection layer being positioned on the opposing sides of the second element forming region, respectively;

a second contact element for electrical connection between the second power supply line and the fourth metallic interconnection layer, wherein the basic memory cells are arranged in rows and columns, the first conductive word line of each of the basic memory cells is connected to each other's first conductive word line, the first metallic interconnection layer of each of the basic memory cells is connected to each other's first metallic interconnection layer, the first power supply line of each of the basic memory cells is connected to each other's first power supply line, the second metallic interconnection layer of each of the basic memory cells is connected to each other's second metallic interconnection layer, one row of the basic cells are arranged for every plural rows of the basic memory cells, the second conductive word line of each of the basic cells is connected to the first conductive word line, the third metallic interconnection layer is connected to the first metallic interconnection layer to thereby prevent delay of potential variations of the first and second conductive word lines, the second power supply line of each of the basic cells is connected to the first power supply line, and the fourth metallic interconnection layer is connected to the second metallic interconnection layer to thereby prevent a power supply potential from dropping, wherein said first contact element and a nearby said second contact element are arranged on a line perpendicular to said first and second conductive word lines.

* * * * *